Sept. 19, 1961 R. L. TRENT 3,001,109

TRANSISTOR PACKAGE DESIGN

Filed June 17, 1960 3 Sheets-Sheet 1

INVENTOR

Robert L. Trent

BY Stevens, Davis, Miller & Mosher

ATTORNEYS

Sept. 19, 1961 R. L. TRENT 3,001,109

TRANSISTOR PACKAGE DESIGN

Filed June 17, 1960 3 Sheets-Sheet 2

INVENTOR

Robert L. Trent

BY Stevens, Davis, Miller & Mosher

ATTORNEYS

INVENTOR
Robert L. Trent

BY Stevens, Davis, Miller & Mosher
ATTORNEYS

United States Patent Office 3,001,109
Patented Sept. 19, 1961

3,001,109

TRANSISTOR PACKAGE DESIGN

Robert L. Trent, Mountain View, Calif., assignor to Texas Instruments Incorporated, Dallas, Tex., a corporation of Delaware Filed June 17, 1960, Ser. No. 36,936
6 Claims. (Cl. 317—234)

The present invention relates to a transistor package design and more particularly to a transistor package design adapted to mass production techniques.

A conventional transistor package consists of a can member fixed to a header member upon which is mounted a semiconductor element coupled to leads extending through the header. The can and the header members are suitably joined together to hermetically seal the package into a unitary structure.

In the manufacture of transistor packages, it is desirable to eliminate certain fabrication problems which affect the operating characteristics of the encapsulated semiconductor element. For example, sealing vapors which are evolved when the can is bonded to the header will contaminate the semiconductor element and affect its characteristics. It is obvious that the fabrication of a transistor package involves the adherence to close tolerances to achieve a suitable seal between the can and the header to prevent contamination of the encapsulated semiconductor element. Also, the heat-dissipating characteristics of a transistor are of such importance that it controls, among other considerations, the package configuration and the materials utilized. The transistor package must include suitable mounting means for the semiconductor element to reduce or minimize the heating problem and assist in preventing the electrical degradation of the element.

Another factor of great importance is reduction of cost. A header may be as much as one-quarter of the total prime cost of a device. It is readily seen that a device configuration which would allow complete testing of the semiconductor element prior to installation on the header and which would allow economical salvage of the header would provide a great competitive advantage.

According to the present invention, the active semiconductor element is mounted on a rigid flag. The unit is processed and tested while mounted on this flag, whereas in the prior art, the semiconductor elements are normally processed on the header to facilitate handling of the element. The element attached to the flag is mounted on the header after completion of the processing steps. Only the flag and leads are attached to the header, there being no necessity to actually make further contact to the semiconductor wafer itself. There is never any requirement that the header be subjected to any of the clean-up etches normally required in processing semiconductor elements, and only good elements are ever committed to a header.

After the holder has been attached to the header, a cylindrical preform of suitable desiccant is positioned on the header to shield the semiconductor device from any contaminating vapors which may be released at the time the can is hermetically bonded to the header and absorb any vapors which may be trapped within the enclosure.

The package configuration of the present invention is especially adaptable to devices utilizing glass headers which have little heat dissipating capacity in that the flag is of material having good thermal conductive qualities, and includes an upper portion which is maintained in intimate contact with the can, thereby providing a good path for conducting heat away from the device, thus improving the device operating characteristics.

It is therefore one object of the present invention to provide a transistor package configuration especially adapted for use with a glass header.

Another object of the present invention is to provide a transistor package which allows the semiconductor element to be processed and tested before commitment to a header.

Still another object of this invention is to shield the semiconductor element from contaminants released when the header is bonded to the can.

Another object of the present invention is to provide a transistor package utilizing a heat sink to minimize the heat transfer problem.

A further object of the invention is to provide a transistor package utilizing improved fabricating techniques to facilitate the mass production thereof.

Other objects and many of the attendant advantages of this invention will be readily appreciated as the same becomes better understood by reference to the following detailed description when considered in connection with the accompanying drawings in which like reference numerals designate like parts throughout the figures thereof and wherein.

Figure 1:
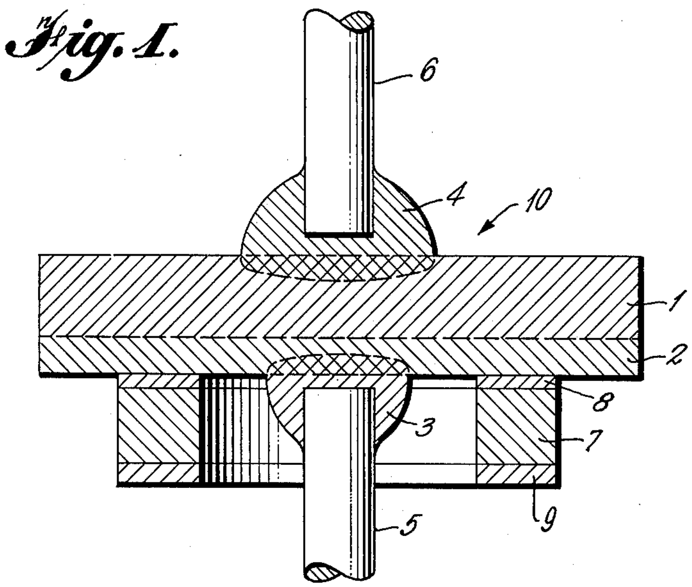
FIGURE 1 is a view in cross section of the semiconductor element used in the preferred embodiment of the present invention.

Referring now to the drawings, in FIGURE 1 there is illustrated a preferred embodiment of a semiconductor element 10 which may be used in practicing the present invention. The semiconductor element comprises a collector portion 1 contiguous to a diffused base layer 2. The emitter 3 is formed by alloying a body of material of opposite type conductivity to that contained in the base layer 2 into the base layer. The collector dot 4 forms ohmic contact with the collector 1 and serves as a means for making contact to the collector. In this preferred example, the leads 5 and 6 are cast into the emitter 3 and collector contact 4 during the alloying process. Contact to the base region is made by washer 7 through clad material 8 which has a higher melting point than the clad material 9 on the opposite end of the washer.

Figure 2:
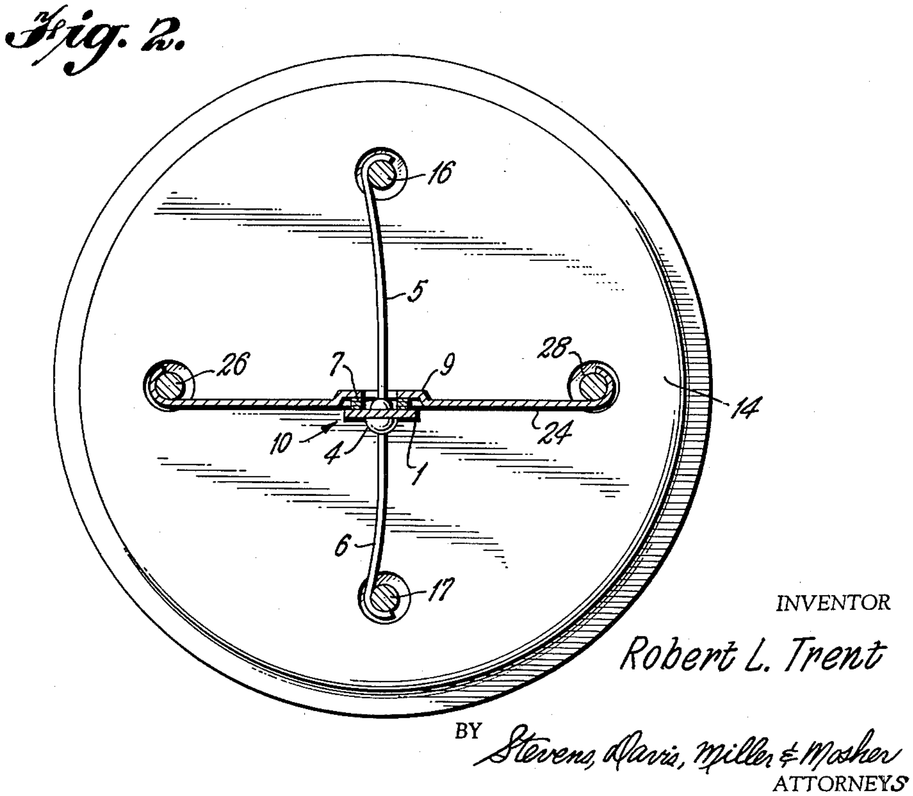
FIGURE 2 is a plan view, partially in cross section, showing the element of FIGURE 1 mounted upon a header.

Referring now to FIGURE 2, the semiconductor element described with reference to FIGURE 1 is shown mounted upon a substantially rectangular-shaped flag member 24, composed of tin clad copper, or the like. The flag 24 provides a convenient means for handling the device during the processing and testing operations. Once the processing and testing is complete, the flag 24 is attached to terminals 26 and 28, and the leads 5 and 6 are attached to terminals 16 and 17, respectively, of header 14. It must be noted that the processing and testing of the transistor element is completed before the flags and leads were actually attached to the header 14, thereby ensuring that each device mounted upon a header will be of satisfactory quality, thus eliminating the loss of headers in production.

Figure 3:
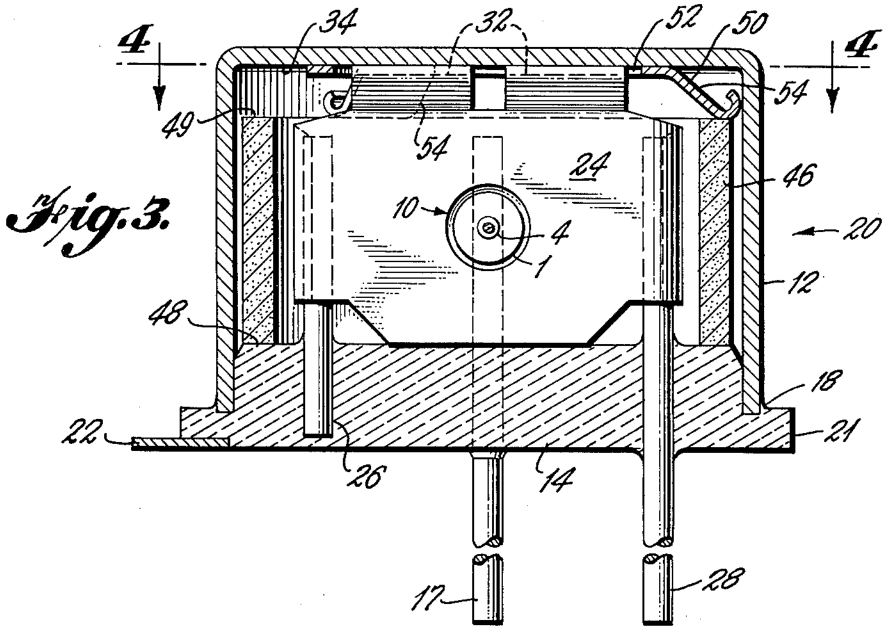
FIGURE 3 is a sectional side view of a preferred embodiment of the invention.
Figure 4:
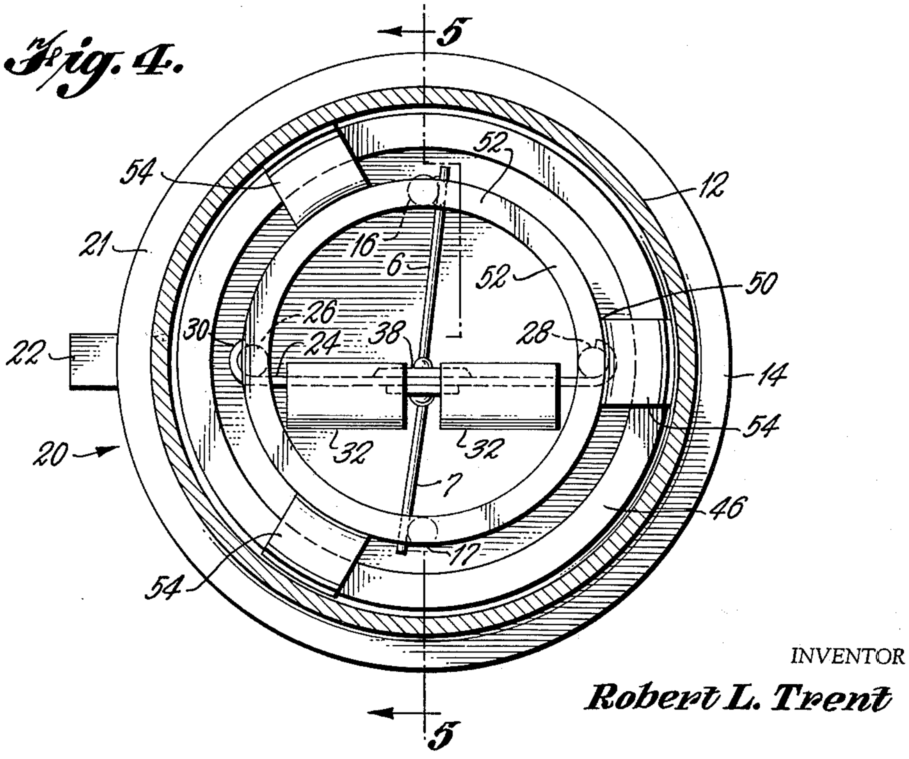
FIGURE 4 is a plan view taken on the line 4—4 of FIGURE 3, looking in the direction of the arrows.
Figure 5:
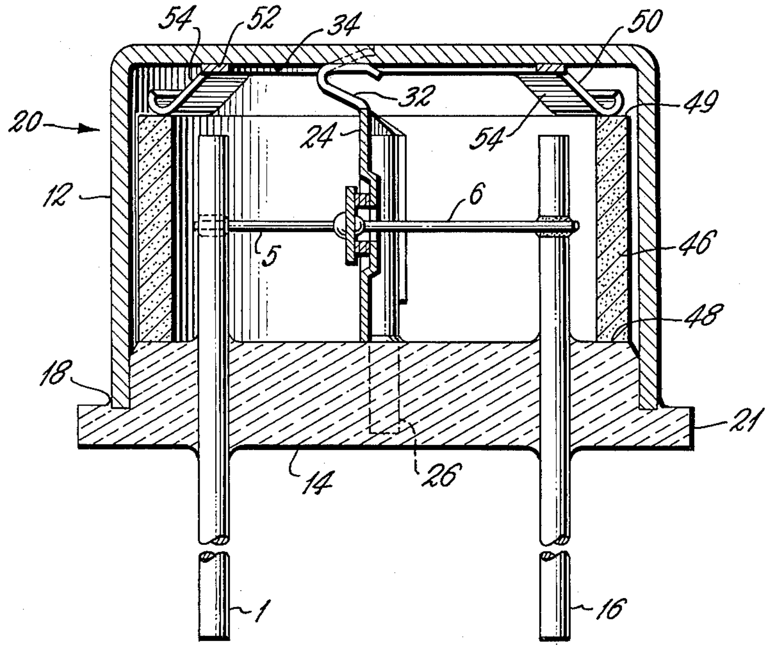
FIGURE 5 is a side view of a section of the device taken on the line 5—5 of FIGURE 4, looking in the direction of the arrows.
Figure 6:
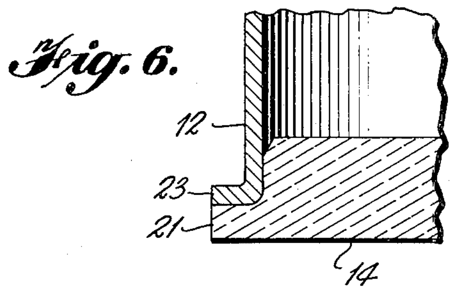
FIGURE 6 is a sectional side view of a segment of the device of FIGURE 5 showing a modification of the can with an integral flange portion.
Figure 7:
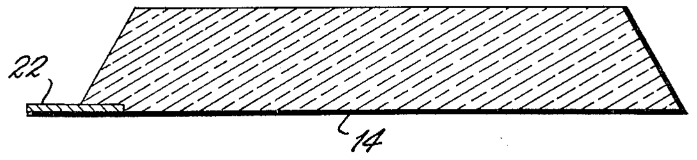
FIGURE 7 is a view in section of a header such as may be used in practicing the invention.

Referring now to FIGURES 3, 4, and 5 of the drawings, there is illustrated a preferred embodiment of a transistor package 20 comprising a cup-shaped can 12, composed of a copper or copper-clad material, having suitable end closure means, such as a glass header 14, carrying a plurality of metallic lead-in conductors 16. The header is joined to the rim 18 of the can or, alternately if desired, to an integral radially extending flange 23, as shown in FIGURE 6, by suitably bonding the components together to form a hermetic seal. The rim of the can is positioned concentrically upon the header 14 and in registry with the integral header flange 21. If desired, the header 14 may be formed resembling a frustum of a cone, as shown in FIGURE 7, having a suitable insert 22 serving as a transistor orientation locator.

The ends of the flag 24 are turned in to securely clamp about the base contact lead 28 and the mounting lead 26 to maintain the flag in a substantially upright position upon the header. As shown best in FIGURE 5, the flag 24 is formed with resilient integral flange portions 32 which press against the interior top portion 34 of the can. Thus, with the can 12 coaxially mounted on the glass header 14, the resilient flange portion of the flag 24 will be in positive contact with the can to provide a heat-dissipating path between the semiconductor element 10 mounted on the flag 24 and the can 12. In this manner, heat is directly conducted from within the package to a relatively large heat sink provided by the copper can. Alternately, the flag 24 may be formed without the resilient flange portions 32 to eliminate contact with the interior surface 34 of the can. In this instance, a suitable transistor package filler material, such as inert fluorocarbon fluids, or the like can be used to provide a path for thermal conduction to the walls of the can.

A sleeve means 46 is concentrically mounted within the transistor package between the interior wall of the can and the turned-in ends of the flag 24 to shield the semiconductor element 10 from vapors created when the can 12 is bonded to the header 14. The sleeve means is provided with a lower end 48 supported upon the glass header 14 and with a top end 49. The sleeve 46 is composed of a desiccant material to absorb any contaminating vapors sealed within the transistor package. These vapors, if not absorbed by a desiccant, would contaminate the semiconductor element 10 and affect its electrical characteristics. The sleeve is maintained within the transistor package in a fixed concentric position with respect to the flag 24 by a hold-down ring 50 composed of a metal, such as beryllium copper, or the like. As best seen in FIGURE 4, the hold-down ring consists of a main ring portion 52 formed with a plurality of radially extending resilient tabs 54. The hold-down ring is mounted within the package with the tabs 54 contacting the top end 49 of the sleeve and with the main ring portion 52 contacting the interior can surface 34. The main ring portion 52 may be bonded to the surface 34 to position the ring 50.

Thus, a transistor package is provided in which the various elements are simply and quickly fabricated so as to promote the dissipation of heat while maintaining a contamination-free environment for the encapsulated semiconductor element. It should be understood, of course, that the foregoing disclosure relates to only a preferred embodiment of the invention, and that it is intended to cover all changes and modifications of the examples of the invention herein chosen for the purposes of the disclosure, which do not constitute departures from the spirit and scope of the invention as set forth in the appended claims.

What is claimed is:

1. A transistor package comprising a header member, a can member concentrically mounted on said header member, supporting means mounted on said header and biasing the interior top portion of said can, a semiconductor element mounted on said supporting means and thermally coupled to said can, desiccant means mounted within the package radially spaced from said supporting means, and resilient means biasing said desiccant means and said interior top portion to prevent relative movement therebetween.

2. A transistor package comprising a header member having a plurality of lead-in conductors, a mounting lead fixed to said header to form a lead pattern in combination with said lead-in conductors, a flag member supported on said mounting lead and on one of said plurality of lead-in conductors diametrically aligned therewith, a can member concentrically mounted on said header to enclose said flag member, desiccant means concentrically mounted on said header between said flag member and the interior wall of said can, resilient means coupling said desiccant means and the interior top surface of said can to prevent any relative movement therebetween, heat dissipating means integral with said flag means and in operative contact with the interior top surface of said can, and semiconductor means mounted on said flag means and electrically coupled to each of said lead-in conductors.

3. A transistor package comprising a glass header, a copper can concentrically mounted on said header to form a hermetic seal therebetween, a plurality of lead-in conductors extending through said header, a mounting lead fixed on said header within the package, a flag member clamped between said mounting lead and one of said lead-in conductors, resilient flange means integral with said flag and biasing the interior top surface of said can to provide a heat dissipating path therebetween, a semiconductor element mounted on said flag member and electrically coupled to each of said lead-in conductors, desiccant means concentrically mounted on said header between the interior wall of said can and said flag member to absorb any contaminating vapors located within the package, resilient means biased between said desiccant means and the interior top surface of said can to eliminate any movement therebetween.

4. A package for hermetically sealing a semiconductor element therein, comprising a cup-shaped copper can member, a glass header, a plurality of lead-in conductors extending through said header, a mounting lead supported on said header in parallel relationship with said lead-in conductors, flag means supported between said mounting lead and one of said lead-in conductors diametrically aligned therewith, heat-dissipating flanges integral with said flag means, aperture means centrally located on said flag means to mount the semiconductor element therein, means for electrically coupling the element with each of said lead-in conductors, desiccant means mounted on said header in a concentric relationship to said flag means, said can member concentrically secured to said header means to form a copper-glass seal, resilient hold-down means operatively coacting with said can member and said desiccant means to restrain any movement therebetween, said heat dissipating flanges operatively coupled to the interior surface of said can member to provide a heat-dissipating path between the semiconductor element and said copper can member.

5. A package for hermetically sealing a semiconductor element in a noncontaminated atmosphere, comprising a glass header having a plurality of lead-in conductors wherein one of said conductors serves as a base contact lead, a mounting lead supported on said glass header in a diametrically opposed relationship to said base contact lead, flag means supported on said mounting lead and said base contact lead, said flag means having an aperture for mounting the semiconductor element therein, means electrically coupling the emitter region and the collector region of the semiconductor element to a respective lead-in conductor, said flag means electrically coupling the base of said semi-conductor element to said base contact lead, desiccant means supported on said glass header for absorbing contaminating vapors, a copper can member concentrically mounted on said glass header to form a copper-glass seal therebetween and encapsulate the semiconductor element, resilient means biasing said desiccant means and said can to prevent any relative movement therebetween, resilient flange means integral with said flag means and biasing the interior top surface of said can member to provide a heat-dissipating path therebetween.

6. A package for hermetically sealing a semiconductor element comprising a copper can, a glass header coupled to said can to form a copper-glass seal therebetween, lead-in conductor means extending through said header and electrically coupled to the semiconductor element, a mounting lead fixed to said header, flag means coupled to said mounting lead and to one of said lead-in conductors, said flag means having an aperture for mounting the semiconductor element therein, means coupling said flag means and said copper can to provide a heat-dissipating path from the semiconductor element to a heat sink, means supported on said glass header within the package and concentrically mounted with respect to said flag means to absorb contaminating vapors.

No references cited.